(12) United States Patent
Jo et al.

(10) Patent No.: US 12,159,801 B2
(45) Date of Patent: Dec. 3, 2024

(54) STORAGE DEVICE

(71) Applicant: Murata Machinery, Ltd., Kyoto (JP)

(72) Inventors: Kokai Jo, Ise (JP); Shinji Onishi, Ise (JP); Ken Inada, Ise (JP)

(73) Assignee: Murata Machinery, Ltd., Kyoto (JP)

( * ) Notice: Subject to any disclaimer, the term of this patent is extended or adjusted under 35 U.S.C. 154(b) by 345 days.

(21) Appl. No.: 17/774,909

(22) PCT Filed: Sep. 10, 2020

(86) PCT No.: PCT/JP2020/034269
§ 371 (c)(1),
(2) Date: May 6, 2022

(87) PCT Pub. No.: WO2021/095341
PCT Pub. Date: May 20, 2021

(65) Prior Publication Data
US 2022/0415689 A1    Dec. 29, 2022

(30) Foreign Application Priority Data

Nov. 12, 2019   (JP) ................................. 2019-204470

(51) Int. Cl.
*F16M 11/00*    (2006.01)
*F16M 11/20*    (2006.01)
(Continued)

(52) U.S. Cl.
CPC ....... *H01L 21/67769* (2013.01); *F16M 11/20* (2013.01); *H01L 21/67393* (2013.01)

(58) Field of Classification Search
None
See application file for complete search history.

(56) References Cited

U.S. PATENT DOCUMENTS

| 5,381,738 A | * | 1/1995 | Meyer .................... A47B 5/00 |
| | | | 108/42 |
| 5,592,886 A | | 1/1997 | Williams et al. |

(Continued)

FOREIGN PATENT DOCUMENTS

| JP | 4519473 B2 | 8/2010 |
| JP | 2016-219537 A | 12/2016 |

(Continued)

OTHER PUBLICATIONS

An English translation of the International Preliminary Report on Patentability and Written Opinion dated May 27, 2022, of counterpart PCT International Application No. PCT/JP2020/034269.

(Continued)

*Primary Examiner* — Steven M Marsh
(74) *Attorney, Agent, or Firm* — DLA Piper LLP (US)

(57) ABSTRACT

A storage device includes a pair of supports each extending in an up-and-down direction and spaced apart in a first direction; a pair of attachments each attached to a side surface by a fixing member having a shaft part, the side surface being a surface of each of the pair of supports and facing the first direction; and a platform supported by the pair of attachments and on which an article is to be placed, wherein each of the pair of attachments has a hole through which the shaft part is disposed, and an area of the hole is larger than an area of a cross-section of the shaft part orthogonal to an axial direction of the shaft part to such an extent that the pair of attachments are rotatable along the side surfaces of the pair of supports.

6 Claims, 4 Drawing Sheets

(51) Int. Cl.
     *H01L 21/673*     (2006.01)
     *H01L 21/677*     (2006.01)

(56)         References Cited

U.S. PATENT DOCUMENTS

| | | | | |
|---|---|---|---|---|
| 5,775,655 | A * | 7/1998 | Schmeets | A47B 5/00 |
| | | | | 108/115 |
| 9,888,603 | B1 * | 2/2018 | Vargas | H05K 7/14 |
| 10,470,565 | B1 * | 11/2019 | Levi | A47F 5/103 |
| 11,457,735 | B1 * | 10/2022 | D'Isep | A47B 57/045 |
| 11,641,942 | B1 * | 5/2023 | Rockley | A47B 96/061 |
| | | | | 211/90.02 |
| 2015/0282377 | A1 * | 10/2015 | Hilburn | H05K 7/186 |
| | | | | 248/213.2 |
| 2017/0062255 | A1 | 3/2017 | Omori | |
| 2019/0002200 | A1 | 1/2019 | Yoshimoto et al. | |
| 2019/0067068 | A1 | 2/2019 | Abe et al. | |
| 2019/0198370 | A1 | 6/2019 | Abe et al. | |

FOREIGN PATENT DOCUMENTS

| | | |
|---|---|---|
| JP | 2017-48017 A | 3/2017 |
| JP | 2019-011179 A | 1/2019 |
| JP | 2019-038647 A | 3/2019 |
| JP | 2019-112160 A | 7/2019 |

OTHER PUBLICATIONS

International Search Report dated Oct. 27, 2020 in counterpart International Application No. PCT/JP2020/034269.
Written Opinion dated Oct. 27, 2020 in counterpart International Application No. PCT/JP2020/034269.

* cited by examiner

STORAGE DEVICE

TECHNICAL FIELD

This disclosure relates to a storage device.

BACKGROUND

Conventionally, storage racks configured to store, as stored objects, containers configured to accommodate semiconductor substrates are known. For example, a storage rack described in Japanese Unexamined Patent Publication No. 2019-038647 includes a pair of pillars with recessed grooves formed therein and a platform fixed to the pillars and on which a stored object is to be placed. The platform has a platform body configured to support the stored object and a pair of attachment plates fixed to the pillars. Each of the pair of attachment plates is inserted into the recessed groove of the corresponding pillar and fixed thereto. In other words, in the storage rack described in JP '647, the platform is positioned with respect to the pair of pillars by the recessed grooves.

In the storage rack described in JP '647, because the platform is firmly positioned to the pillars, the flatness (the magnitude of deviation from a geometrically correct plane of the planar form) of the platform body may increase due to the displacement of the attachment plates caused by placing an article (stored object) on the platform or due to the machining accuracy of the recessed grooves of the pillars and the platform, and there may be a situation in which the article cannot be placed stably. When the storage rack described in JP '647 is used, a high level of skill is required during manufacturing because the recessed grooves of the pillars and the platform need to be machined with high precision.

It could therefore be helpful to provide a storage device in which the flatness of a platform on which an article is to be placed can be easily adjusted.

SUMMARY

A storage device may include: a pair of supports each extending in an up-and-down direction and spaced apart in a first direction; a pair of attachments each attached to a side surface by a fixing member having a shaft part, the side surface being a surface of each of the pair of supports and facing the first direction; and a platform supported by the pair of attachments and on which an article is to be placed. Each of the pair of attachments has a hole through which the shaft part is disposed, and the area of the hole is larger than the area of a cross-section of the shaft part orthogonal to the axial direction of the shaft part to such an extent that the pair of attachments are rotatable along the side surfaces of the pair of supports.

In this storage device, the platform is supported by the pair of attachments. The pair of attachments are attached to the pair of supports by the fixing members that are disposed through the holes. Because the area of the hole is larger than the area of a cross-section of the shaft part orthogonal to the axial direction thereof, each of the pair of attachments can be rotated along the side surface of the corresponding support. By rotating the pair of attachments thus configured, the flatness of the platform supported by the pair of attachments can be corrected. Thus, with this storage device, the flatness of the platform on which an article is to be placed can be easily adjusted.

Each of the pair of attachments may have a contact portion in contact with a front surface that is a surface of the corresponding support along the first direction and the up-and-down direction and oriented in a direction in which the platform is located with respect to the support. Accordingly, each of the pair of attachments can be stably rotated about the contact portion as a fulcrum. Thus, with this storage device, the flatness of the platform can be easily adjusted in a more stable manner.

The hole may be formed in plurality in each of the pair of attachments, and the width of each of the holes along a rotation direction of the pair of attachments may be formed to become larger as the distance from the contact portion increases. By this configuration, the width of each hole along the rotation direction of the pair of attachments is larger at a position farther from the contact portion, and thus each of the pair of attachments can be rotated about the contact portion as a fulcrum even when the holes are formed. Furthermore, the width of each hole along the rotation direction of the pair of attachments is smaller at a position closer to the contact portion, and thus the fixing members are less likely to be displaced in the holes, and the pair of attachments can be stably attached in a proper position.

A storage device may include: a pair of supports each extending in an up-and-down direction and aligned in a first direction; a pair of attachments each attached to the pair of supports; and a platform supported by the pair of attachments and on which an article is to be placed. Each of the pair of attachments has: a support attachment surface attached to the corresponding support; an extending surface connected to the support attachment surface and extending in a direction in which the platform is located with respect to the pair of supports; and a platform attachment surface connected to an upper end of the extending surface and extending along a bottom surface of the platform to support the bottom surface from below. Force required to change the angle of the platform attachment surface with respect to the extending surface is smaller than force required to deform the platform.

In this storage device, the platform is supported by the pair of attachments. Each of the pair of attachments is attached to the corresponding support at the support attachment surface. The platform attachment surface extends from the upper end of the extending surface along the bottom surface of the platform. The force required to change the angle of the platform attachment surface with respect to the extending surface is smaller than the force required to deform the platform. Thus, for example, if the pair of platform attachment surfaces are not parallel to each other before the platform is attached (i.e., when there is a misalignment between the pair of platform attachment surfaces), before the platform deforms due to the misalignment when the platform is attached, the angles of the pair of platform attachment surfaces can be changed in a direction to reduce the misalignment. This allows the flatness of the platform to be kept small. Thus, with this storage device, the flatness of the platform on which an article is to be placed can be easily adjusted.

The platform attachment surface may extend along the bottom surface of the platform from a part of the entire length of the upper end of the extending surface. By this simple configuration in which the platform attachment surface is formed only at the part of the upper end of the extending surface, the force required to change the angle of the platform attachment surface with respect to the extending surface can be set smaller than the force required to deform the platform.

Each of the pair of attachments may be formed with a member thinner than the platform. By this simple configuration in which the thickness of each of the pair of attachments is set smaller than that of the platform, the force required to change the angle of the platform attachment surface with respect to the extending surface can be set smaller than the force required to deform the platform.

The article may be a container into which gas is able to be supplied through a supply hole formed in a bottom of the container, and the platform may include a gas supply section configured to supply the gas into the container through the supply hole. By this configuration, the flatness of the platform is adjusted to maintain adhesion between the supply hole of the container and the gas supply section, and thus the gas can be properly supplied into the container.

Thus, it is possible to provide a storage device in which the flatness of the platform on which an article is to be placed can be easily adjusted.

Figure 1:
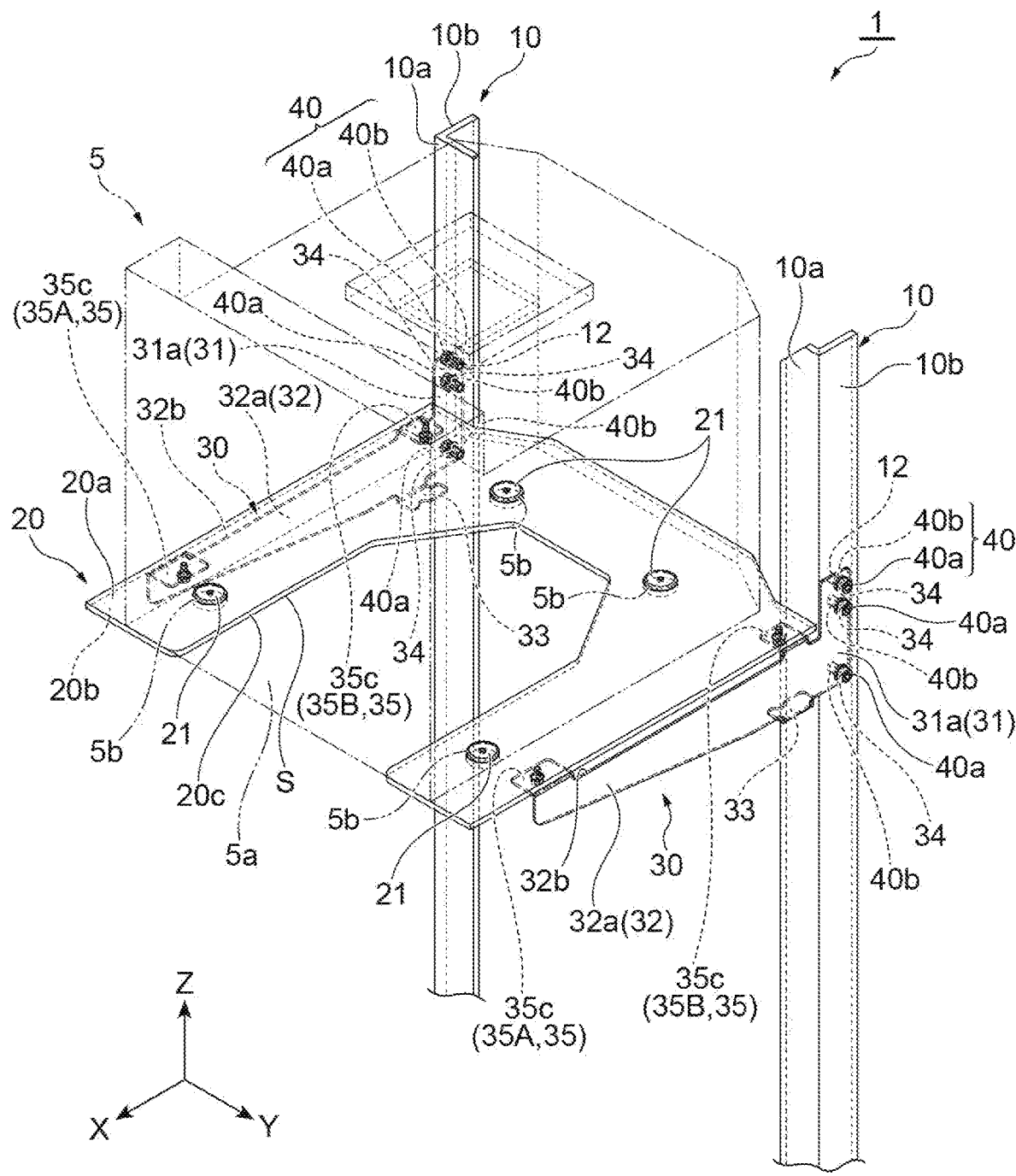
FIG. 1 is a perspective view of a storage device according to one example.

REFERENCE SIGNS LIST 1 storage device
5 container (article)
5a bottom
5b supply hole
10 pillar (support)
10a front surface
10b side surface
12 through hole
20 shelf (platform)
20a upper surface
20b bottom surface
20c recess
21 gas supply section
30 bracket (attachment)
31 support attachment
31a support attachment surface
32 extending portion
32a extending surface
32b upper end
32c lower end
33 contact portion
33a first extension
33b second extension
33c tip
34 hole
35 platform attachment
35a third extension
35b fourth extension
35c platform attachment surface
40 bolt (fixing member)
40a head
40b shaft part

DETAILED DESCRIPTION

An example of our storage device will now be described in detail with reference to the drawings. Like or equivalent elements are designated by like reference signs in the drawings, and duplicate description is omitted. In the following description, for convenience of explanation, the respective axis directions in an orthogonal coordinate system in three-dimensional space are referred to as X-direction, Y-direction, and Z-direction. The X-direction and the Y-direction (one example of a first direction) extend along the horizontal plane, and the Z-direction is an up- and down direction (vertical direction).

Figure 2:
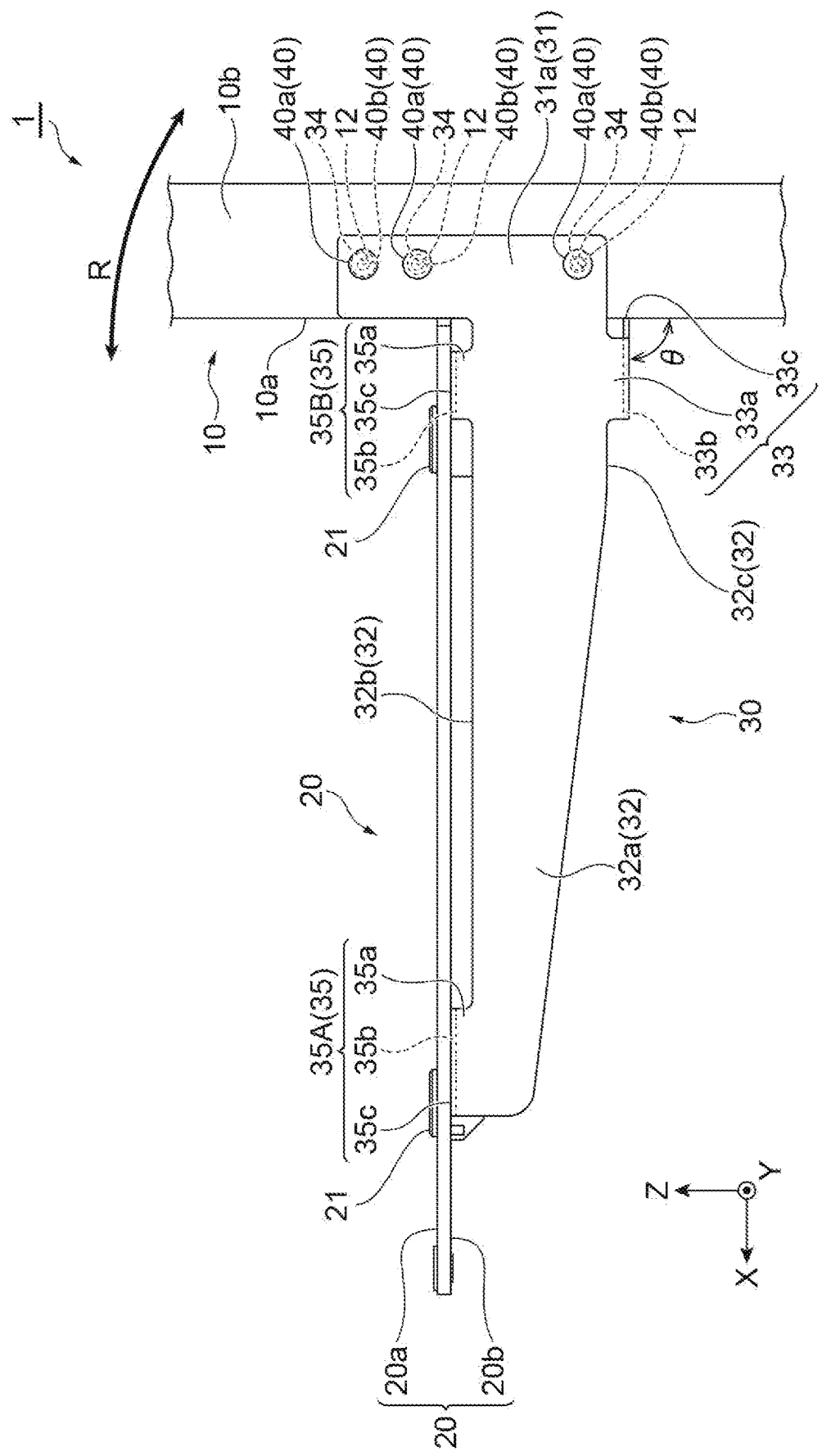
FIG. 2 is a side view of the storage device according to one example.

As illustrated in FIGS. 1 and 2, a storage device 1 according to an example stores therein a container 5 that is one example of an article. The container 5 is, for example, a box-shaped casing (e.g., Front Opening Unified Pod (FOUP)) in which one or more semiconductor wafers or the like are accommodated. The container 5 holds the semiconductor wafers inside and protects the semiconductor wafers. In a bottom 5a of the container 5, supply holes 5b through which the inside of the container 5 is communicated with the outside of the container 5 are formed. Purge gas (e.g., nitrogen gas) is supplied into the container 5 through the supply holes 5b formed in the bottom 5a.

The storage device 1 includes a pair of pillars 10 (one example of supports) each extending in the Z-direction, a pair of brackets 30 (one example of attachments) attached to the pair of pillars 10, a shelf 20 (one example of a platform) supported by the pair of brackets 30 and on which the container 5 is to be placed, and a plurality of bolts 40 (one example of fixing members) fixing each bracket 30 to the corresponding pillar 10. The shelf 20 is located on one side of the X-direction with respect to the pair of pillars 10. The one side of the X-direction (i.e., the side on which the shelf 20 is disposed to the pair of pillars 10) is defined as the front, and the other side of the X-direction is defined as the rear. In the Y-direction, the inner side of the pair of pillars 10 is simply defined as the inner side, and the outer side of the pair of pillars 10 is simply defined as the outer side.

The pair of pillars 10 are provided side by side, for example, separated by a predetermined distance along the Y-direction. Each pillar 10 is an L-shaped member when viewed from above. Specifically, each pillar 10 has a front surface 10a that is a surface facing forward (surface along the Y-direction and the Z-direction) and a side surface 10b that is a surface intersecting the front surface 10a (surface facing outward). The front surface 10a is a surface oriented in a direction in which the shelf 20 described later is located with respect to the pillar 10. As illustrated in FIG. 1, in this example, the side surface 10b of each pillar 10 extends from the outer end in the Y-direction of the front surface 10a to the rear. In the side surface 10b of each pillar 10, through holes 12 through which the bolts 40 are disposed are formed. The through holes 12 penetrate in the Y-direction. The through holes 12 are formed according to the number and positions of holes 34 described later. The bolts 40 inserted through the holes 34 are inserted through the through holes 12, and are fixed by nuts (not illustrated).

The shelf 20 is a member configured to support the container 5. In other words, the container 5 is placed on the shelf 20. The shelf 20 is attached to the pair of pillars 10 with the pair of brackets 30 interposed therebetween. The shelf 20 has a plate-like shape, for example. The bottom 5a of the container 5 is supported by an upper surface 20a of the shelf 20. The pair of brackets 30 are attached to a bottom surface 20b of the shelf 20.

As one example, the shelf 20 has a recess 20c recessed rearward from the front end at its center in the Y-direction, and is formed substantially in a U-shape when viewed from above. The recess 20c forms an open space S that penetrates in the Z-direction and is open to the front side. The shelf 20 may be provided in plurality to the pair of pillars 10. For example, between the pair of pillars 10, a plurality of the shelves 20 may be provided in the Z-direction. In this example, the installation interval between adjacent shelves 20 in the Z-direction is set to be larger than the height (length in the Z-direction) of the container 5.

The depth (length in the X-direction) and width (length in the Y-direction) of the open space S is set appropriately based on, for example, the structure of the container 5 and the structure of a device configured to take out the container 5. The open space S (i.e., the recess 20c) does not necessarily have to be formed.

The shelf 20 further includes gas supply sections 21. The gas supply sections 21 communicate with gas pipes (not illustrated) and a gas cylinder (not illustrated), and supply purge gas therethrough. The gas supply sections 21 are, for example, cylindrical nozzles protruding from the upper surface 20a of the shelf 20. The gas pipes are conduits communicating between the gas supply sections 21 and the gas cylinder. When the container 5 is placed on the upper surface 20a of the shelf 20, the container 5 is positioned so that the supply holes 5b formed in the bottom 5a can engage with the gas supply sections 21. Purge gas is supplied into the container 5 through the supply holes 5b of the container 5, the gas supply sections 21, and the gas pipes, whereby the container 5 is purged. The gas supply sections 21 are provided appropriately according to the number, the size, and the shape of the supply holes 5b of the container 5.

Figure 3:
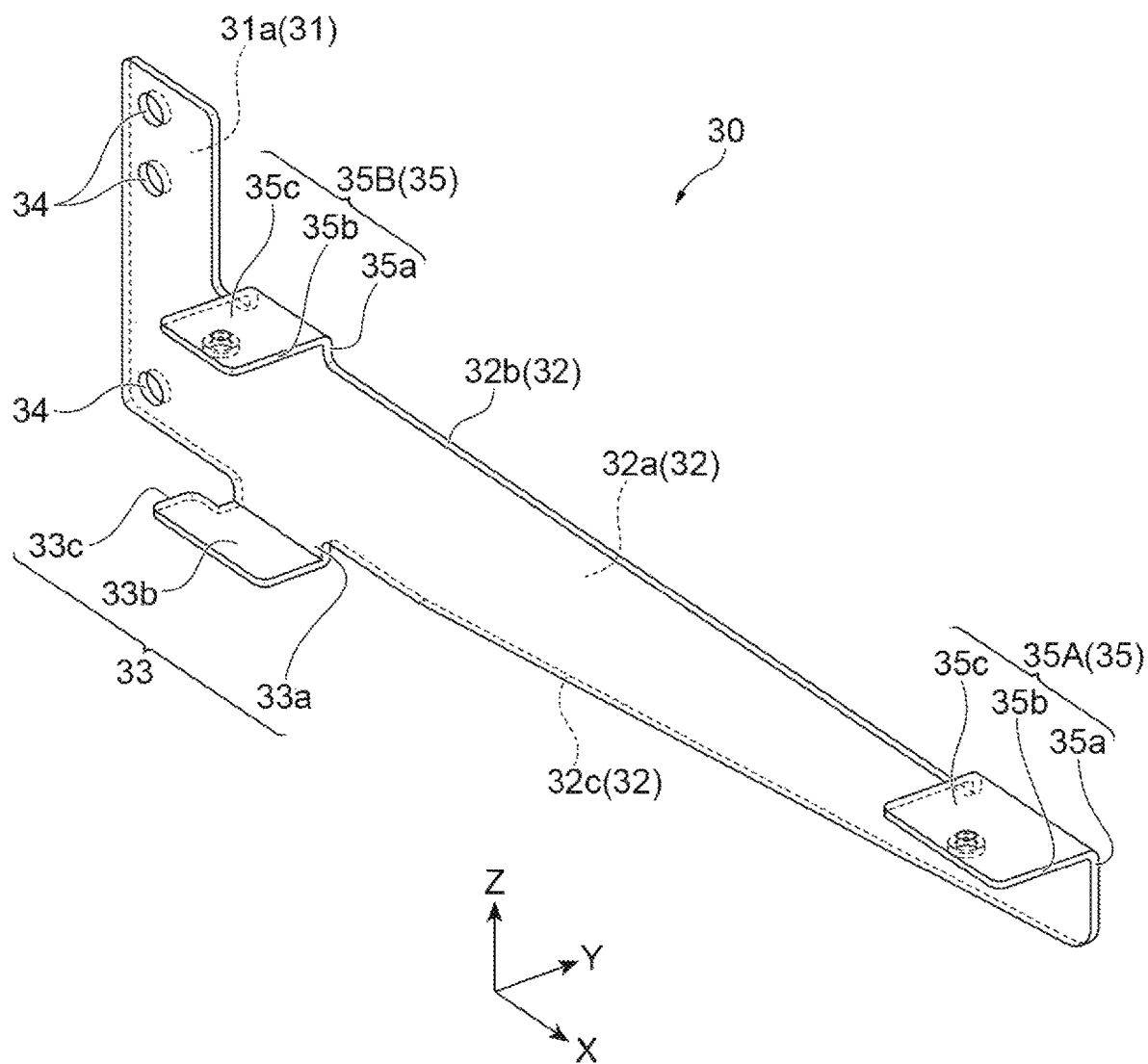
FIG. 3 is a perspective view of an attachment of the storage device illustrated in FIG. 1.

As illustrated in FIGS. 1 and 2, the pair of brackets 30 are members configured to support the shelf 20. Each bracket 30 is attached to the side surface 10b of the corresponding pillar 10. As illustrated in FIGS. 1, 2, and 3, each bracket 30 has a support attachment 31 facing the side surface 10b of the corresponding pillar 10, an extending portion 32 connected to the support attachment 31, a contact portion 33 connected to the extending portion 32, and a platform attachment 35 connected to an upper end 32b of the extending portion 32. The support attachment 31, the extending portion 32, the contact portion 33, and the platform attachment 35 each have a plate-like shape, for example.

The support attachment 31 is attached to the side surface 10b of each pillar 10 by the bolts 40. The support attachment 31 extends in the X-direction and the Z-direction. The length and shape of the support attachment 31 in the X-direction and the Z-direction are set appropriately according to the size of the side surface 10b of each pillar 10. As one example, the support attachment 31 is provided on the side surface 10b, on the outer side, of each pillar 10 (i.e., surfaces of the respective pillars 10 facing away from each other in the Y-direction).

The support attachment 31 has a support attachment surface 31a that is an outer surface thereof. The support attachment surface 31a is a surface attached to the side surface 10b of each pillar 10 and extending along the side surface 10b. The holes 34 are formed in the support attachment 31. Details of the holes 34 will be described later.

The extending portion 32 is connected to a front end of the support attachment 31 and extends in the direction in which the shelf 20 is located with respect to each pillar 10 (forward), along the side surface 10b of each pillar 10. The extending portion 32 is set appropriately according to the size and shape of the container 5 to be stored below. As one example, the extending portion 32 extends from the front surface 10a of the pillar 10 to a position posterior to the front end of the shelf 20. In other words, when viewed from the Y-direction, the front end of the shelf 20 protrudes forward from the front end of the extending portion 32. For example, the extending portion 32 extends to the position of the gas supply section 21 provided at a foremost position in the X-direction. The extending portion 32 has an extending surface 32a that is an outer surface thereof. The extending surface 32a is a surface extending along the side surface 10b of each pillar 10 and is connected to the support attachment surface 31a. In this example, the support attachment surface 31a and the extending surface 32a are continuous and form the same plane. The extending portion 32 (extending surface 32a) has an upper end 32b along the X-direction. The extending portion 32 has a lower end 32c that moves upward as it moves forward. Thus, the extending portion 32 has a shape in which the length in the Z-direction (i.e., the distance between the upper end 32b and the lower end 32c) decreases as it moves forward.

The contact portion 33 has a hook-like shape, for example. The contact portion 33 is connected, for example, to a rear portion of the lower end 32c (a portion near each pillar 10). The contact portion 33 has a first extension 33a that is a portion extending downward from the lower end 32c, and a second extension 33b extending inward from the lower end of the first extension 33a along the bottom surface 20b of the shelf 20. The first extension 33a and the second extension 33b are formed substantially in an L-shape when viewed from the X-direction. At least a portion of the second extension 33b protrudes rearward, i.e., toward the front surface 10a of each pillar 10. As illustrated in FIG. 2, a tip 33c of the second extension 33b on the front surface 10a side of each pillar 10 is formed to be in contact with the front surface 10a of the pillar 10 when the corresponding bracket 30 is attached to the pillar 10. The first extension 33a may be omitted. In other words, the second extension 33b may be directly connected to the lower end 32c of the extending portion 32.

The holes 34 penetrate the support attachment 31 in the Y-direction. The support attachment 31 is attached to the side surface 10b of each pillar 10 by the bolts 40 disposed through the holes 34. Details of the bolts 40 will be described first. The bolts 40 inserted into the holes 34 are inserted into the through holes 12 in the side surface 10b of each pillar 10. The bolts 40 inserted into the through holes 12 are fixed to the pillar 10 by nuts (not illustrated) inside. Each bolt 40 has a shaft-like shape. The bolts 40 are provided according to the number and positions of the holes 34. Each bolt 40 has a head 40a that is brought close to or into contact with the support attachment surface 31a of the support attachment 31 and a shaft part 40b inserted into the hole 34 and the through hole 12. The head 40a and the shaft part 40b have cylindrical shapes, for example.

The head 40a has a cross-section the area of which is larger than the area of a cross-section of the shaft part 40b orthogonal to the axial direction (Y-direction) and the area of the hole 34. The area of the hole 34 refers to the area of the hole 34 when viewed from the Y-direction. When each of the pair of brackets 30 is attached to the side surface 10b of the corresponding pillar 10 by the bolts 40, inner surfaces of the heads 40a are brought into contact with the support attachment surface 31a of the support attachment 31, whereby outward movement of the support attachment 31 is restricted. The shaft part 40b is longer than the thickness (length in the Y-direction) of the support attachment 31 and extends in the Y-direction.

Figure 4:
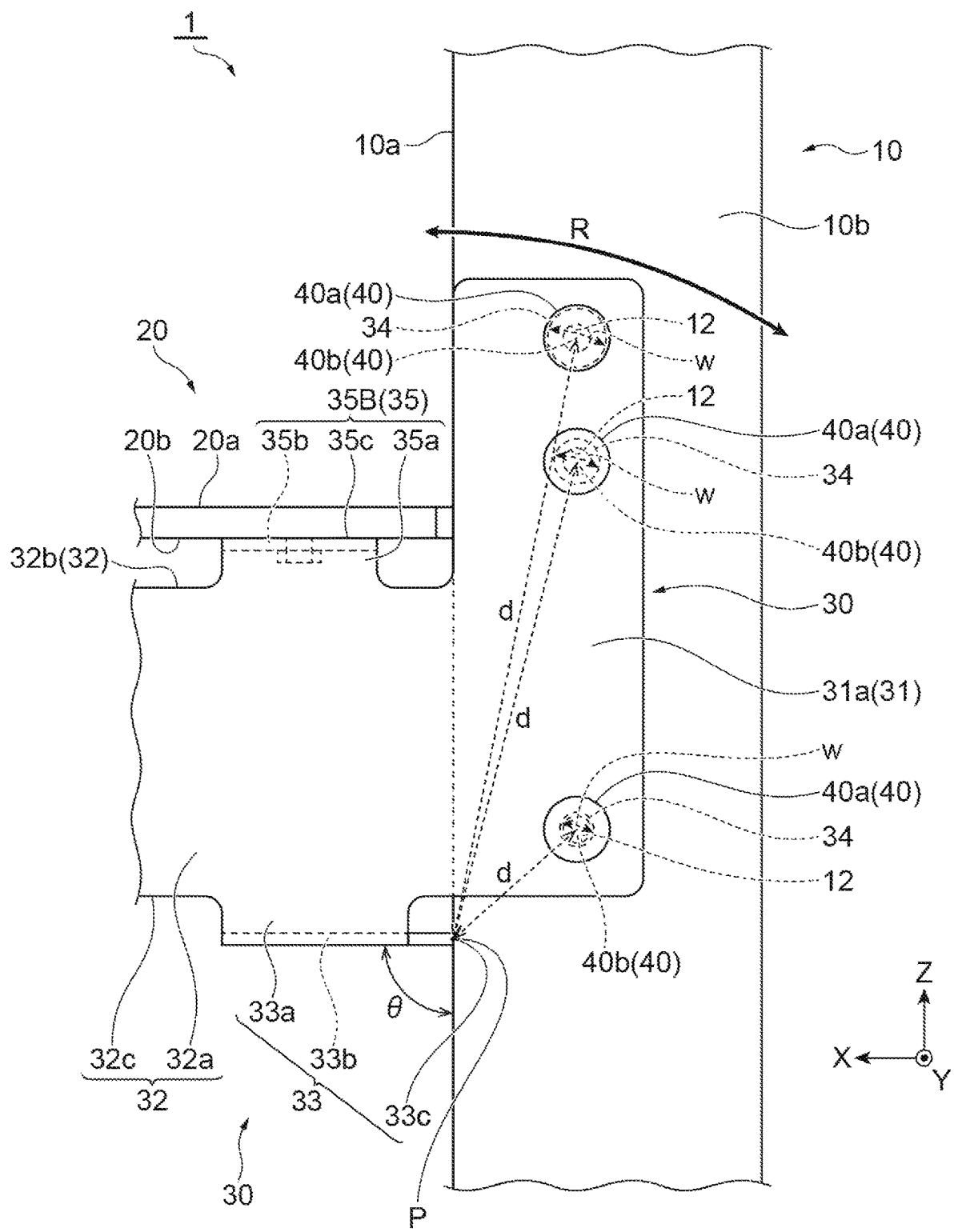
FIG. 4 is a side view illustrating part of the storage device illustrated in FIG. 2 in an enlarged manner.

As illustrated in FIG. 4, the holes 34 are formed in the support attachment 31. The shape of each hole 34 is, for example, circular when viewed from the Y-direction. The area of the hole 34 is larger than the area of a cross-section of the shaft part 40*b* of the bolt 40 orthogonal to the Y-direction to such an extent that each of the pair of brackets 30 can be rotated along the side surface 10*b* of the corresponding pillar 10. In other words, the diameter of the hole 34 is larger than the diameter of the shaft part 40*b*. Thus, when the support attachment 31 is attached to the side surface 10*b* of each pillar 10 by the bolts 40 and fixing of the support attachment 31 by the bolts 40 and the nuts is released (or loosened) on the side surface 10*b* of the pillar 10, the corresponding bracket 30 can be rotated about the tip 33*c* of the contact portion 33 along a rotation direction R. The degree of fixing of the support attachment 31 to the side surface 10*b* of each pillar 10 can be adjusted by adjusting the degree of tightening of the nuts. The rotation direction R is the circumferential direction of a circle centered on the tip 33*c* of the contact portion 33 in a plane along the side surface 10*b* of each pillar 10. In other words, the contact position between the tip 33*c* of the contact portion 33 and the front surface 10*a* of each pillar 10 when viewed from the Y-direction constitutes a rotation center position P of the corresponding bracket 30. Thus, the rotation center position P and the rotation direction R of each bracket 30 can be adjusted by appropriately designing the length of the first extension 33*a* in the Z-direction and setting the contact position.

In each hole 34, a width w thereof along the rotation direction R is formed to become larger as the distance from the tip 33*c* of the contact portion 33 increases. As one example, the above-described configuration is made by forming the hole 34 in a circular shape and designing the diameter of the hole 34 appropriately. In other words, the diameter of each hole 34 is designed to become larger as the distance d from the rotation center position P to the hole 34 increases.

The platform attachment 35 has, for example, a third extension 35*a* extending upward from the upper end 32*b* of the extending portion 32, and a fourth extension 35*b* extending inward from the third extension 35*a* along the bottom surface 20*b* of the shelf 20. The fourth extension 35*b* is joined to the bottom surface 20*b* of the shelf 20 to support at least a part thereof from below. The shelf 20 and the platform attachment 35 are joined by pins and nuts, for example. The third extension 35*a* may be omitted. In other words, the fourth extension 35*b* may be directly connected to the upper end 32*b* of the extending portion 32.

The platform attachment 35 is provided at a portion of the entire length of the upper end 32*b* of the extending portion 32. The platform attachment 35 is formed in plurality (two in this example) on mutually separated portions of the upper ends 32*b* of the extending portions 32. As one example of the platform attachments 35, a platform attachment 35 located on the front side in the X-direction is referred to as a first platform attachment 35A, and a platform attachment 35 located on the rear side in the X-direction is referred to as a second platform attachment 35B. Because the first platform attachment 35A is located at a larger distance from the tip 33*c* of the contact portion 33 in the X-direction than the second platform attachment 35B is, the moment therein about the tip 33*c* of the contact portion 33 is larger. Thus, in this example, by setting the length of the first platform attachment 35A in the X-direction longer than the length in the X-direction of the second platform attachment 35B, imbalance in the moment in the extending portion 32 is suppressed.

The platform attachments 35 (the first platform attachment 35A and the second platform attachment 35B) are connected to the upper end 32*b* of the extending portion 32 and each have a platform attachment surface 35*c* that extends along the bottom surface 20*b* to support the bottom surface 20*b* of the shelf 20 from below. The platform attachment surface 35*c* is the upper surface of the fourth extension 35*b*, for example. The platform attachment surface 35*c* is, for example, substantially parallel to the second extension 33*b* of the contact portion 33. At least a part of the platform attachment surface 35*c* is joined to the bottom surface 20*b* of the shelf 20. The platform attachment 35 (platform attachment surface 35*c*) is provided, for example, at a position close to each gas supply section 21 provided to the shelf 20 in the X-direction. The gas supply section 21 is subjected to the load of the container 5 placed on the shelf 20 or an impact at the time of placement of the container 5, which may deform the shelf 20. By providing the platform attachment 35 at a position close to the gas supply section 21, the platform attachment 35 can bear the force applied to the shelf 20. The force applied to the shelf 20 when the container 5 is placed can be distributed to the extending portion 32, the support attachment 31, and each pillar 10 via the platform attachment 35. Thus, the force applied to a portion of the shelf 20 to which the platform attachment 35 is not attached in the X-direction can be reduced, and the amount of deformation of the shelf 20 can be reduced.

The force required to change the angle of the platform attachment surface 35*c* with respect to the extending surface 32*a* is smaller than the force required to deform the shelf 20. In other words, the strengths of the shelf 20 and the pair of brackets 30 are adjusted such that the above relation holds. More specifically, at least one of the pair of brackets 30 will deform first before the shelf 20 placed on the pair of brackets 30 is distorted or bent. For example, the force required to bend the fourth extension 35*b* of the platform attachment 35 downward toward the third extension 35*a* is smaller than the force required to curve a part of the shelf 20 downward to increase its flatness. Changing the angle of the platform attachment surface 35*c* toward the extending surface 32*a* includes changing the angle of the fourth extension 35*b* with respect to the third extension 35*a*. For example, at the boundary between the third extension 35*a* and the fourth extension 35*b*, the angle of the fourth extension 35*b* with respect to the third extension 35*a* is changed by bending the entire fourth extension 35*b* toward the third extension 35*a*, or by bending a part of the fourth extension 35*b* toward the third extension 35*a*. At this time, the third extension 35*a* may bend in the Z-direction.

To allow the angle of the platform attachment surface 35*c* with respect to the extending surface 32*a* to be changed more easily than with respect to the shelf 20, the platform attachment 35 is formed to have a strength lower than that of the shelf 20, for example. For example, each bracket 30 may be formed with a member thinner than the shelf 20. The strength of each entire bracket 30 does not have to be uniformly low, and at least the platform attachment 35 may be formed with a member having a strength lower than that of the shelf 20.

If the respective platform attachment surfaces 35*c* of the pair of brackets 30 are not parallel to each other and the strength of the platform attachments 35 is higher than that of the shelf 20, there may be a situation in which the shelf 20 is not supported by the platform attachments 35 in a balanced manner and the load (force received from the platform attachments 35 or the container 5) is applied in a concentrated manner onto a part of the shelf 20, thereby causing the shelf 20 to deform. In contrast, in this example, each platform attachment 35 extends from a portion of the upper end 32*b* of the extending portion 32 and is formed to have a strength lower than that of the shelf 20. Thus, even when the respective platform attachment surfaces 35c of the pair of brackets 30 are not parallel to each other as described above, the platform attachments 35 deform before the shelf 20 does, whereby the flatness of the shelf 20 can be reduced. For example, even when there is a machining error in the platform attachments 35 or all over the brackets 30, the platform attachments 35 deform first such that the machining error is resolved before the shelf 20 deforms due to the machining error. Thus, the influence of the machining error of the platform attachments 35 or the brackets 30 on the flatness of the shelf 20 is reduced. As described above, the platform attachments 35 deform before the shelf 20 does, whereby deformation of the shelf 20 caused by the force acting on the shelf 20 from the platform attachments 35 or the container 5 is suppressed, and the flatness is reduced.

The following describes a method of attaching the shelf 20 and the pair of brackets 30 to the pair of pillars 10. To begin, the pair of brackets 30 are connected to the side surfaces 10b of the pair of pillars 10 by the bolts 40. The bolts 40 are inserted into the respective holes 34 formed in the support attachment 31 of each bracket 30 and also inserted into the respective through holes 12 in the corresponding pillar 10, and are fixed by tightening nuts (not illustrated). The support attachment 31 is fixed in a manner sandwiched between the heads 40a of the bolts 40 and the side surface 10b of each pillar 10. At this time, a rotation angle θ of each bracket 30 with respect to the corresponding pillar 10 is adjusted. The rotation angle θ is an angle of the platform attachment surface 35c (second extension 33b) with respect to the front surface 10a of each pillar 10 in the rotation direction R. The rotation angle θ is adjusted, for example, such that the platform attachment surface 35c becomes level with the ground surface (not illustrated) of the pair of pillars 10 (such that the flatness decreases).

Subsequently, the shelf 20 is disposed on the platform attachment surfaces 35c. The shelf 20 is joined to the platform attachments 35 by pins and nuts (not illustrated), whereby the horizontal displacement thereof from the pair of brackets 30 is prevented. The shelf 20 and the pair of brackets 30 are attached together, whereby the configurations and functions described above are obtained.

The following describes functional effects of the respective parts of the storage device 1 when the container 5 is transferred to the storage device 1 from the front side. The container 5 is placed rearward (in a direction from the shelf 20 toward the front surface 10a of each pillar 10) upon the upper surface 20a of the shelf 20. At this time, the supply holes 5b of the container 5 engage with the gas supply sections 21. Because the platform attachments 35 are provided at positions close to the gas supply sections 21 in the X-direction, the platform attachment surfaces 35c of the platform attachments 35 receive the load from the container 5 via the shelf 20. By this configuration, the load of the container 5 can be applied to the extending portions 32, the support attachments 31, and the pillars 10 via the platform attachments 35, and thus the force applied to a portion of the shelf 20 to which the platform attachments 35 are not attached in the X-direction can be reduced, and the amount of deformation of the shelf 20 can be reduced.

When the container 5 is placed on the upper surface 20a of the shelf 20, an impact may be applied to the shelf 20 and the pair of brackets 30. For example, when the container 5 hits the gas supply section 21 when the container 5 is engaged with the gas supply section 21, or when the container 5 is placed on the upper surface 20a with great force, an impact may be applied to the shelf 20 and the pair of brackets 30. When the container 5 is placed on the upper surface 20a of the shelf 20, a load is applied to the shelf 20 and the pair of brackets 30.

When the shelf 20 and the pair of brackets 30 are subjected to the impact at the time of placement of the container 5 or the load of the container 5 as described above, the flatness of the shelf 20 may increase. For example, when the flatness of the shelf 20 has increased, the rotation angles θ may be different from each other at the pair of brackets 30. At this time, the flatness of the shelf 20 can be adjusted by rotating the support attachment 31 of each bracket 30 about the tip 33c of the contact portion 33 (rotation center position P) as a fulcrum. Details of this are described below.

By loosening each nut (not illustrated) at the corresponding bolt 40, fixing of each bracket 30 to the corresponding pillar 10 is released (or loosened). Because the area of the hole 34 is larger than the area of a cross-section of the shaft part 40b of the bolt 40 orthogonal to the Y-direction to such an extent that each bracket 30 can be rotated, the support attachment 31 can be moved according to the shapes of the holes 34. For example, when the platform attachment surface 35c is to be adjusted to be positioned lower than the state before the adjustment, the positions of the respective holes 34 when viewed from the Y-direction (the center position viewed from the Y-direction) may be rotated about the tip 33c of the contact portion 33 to be displaced forward in the rotation direction R. When the platform attachment surface 35c is to be adjusted to be positioned higher than the state before the adjustment, the positions of the respective holes 34 when viewed from the Y-direction may be rotated about the tip 33c of the contact portion 33 to be displaced rearward in the rotation direction R.

As described above, by adjusting the position of the platform attachment surface 35c of at least one of the pair of brackets 30, i.e., the rotation angle θ, the flatness of the shelf 20 can be adjusted to decrease. By adjusting the position of the platform attachment surface 35c of at least one of the pair of brackets 30, i.e., the rotation angle, the shelf 20 can be adjusted to be parallel to the ground surface of the storage device 1 (such that the flatness decreases).

As described above, in the storage device 1, the shelf 20 is supported by the pair of brackets 30. The pair of brackets 30 are attached to the pair of pillars 10 by the bolts 40 disposed through the holes 34. Because the area of each hole 34 is larger than the area of a cross-section of the corresponding bolt 40 (shaft part 40b) orthogonal to the axial direction (Y-direction) thereof, each bracket 30 can be rotated along the side surface 10b of the corresponding pillar 10. In other words, the diameter of the hole 34 is formed larger than a size corresponding to the diameter of the shaft part 40b (i.e., a size that substantially matches the diameter of the shaft part 40b). This allows the positions of the holes 34 to be moved along the XZ plane with the shaft parts 40b being disposed through the holes 34, and allows each bracket 30 to be rotated with the movement of the holes 34. By rotating the pair of brackets 30 thus configured, the flatness of the shelf 20 supported by the pair of brackets 30 can be corrected. Thus, with the storage device 1, the flatness of the shelf 20 on which the container 5 (article) is to be placed can be easily adjusted.

Because each bracket 30 has the contact portion 33 being in contact with the front surface 10a of the corresponding pillar 10, the bracket 30 can be stably rotated about the contact portion 33 as a fulcrum. Thus, the flatness of the shelf 20 can be easily adjusted in a more stable manner.

Furthermore, by providing the contact portion 33, the rotation center position P of each bracket 30 can be adjusted flexibly and easily.

Because the width w along the rotation direction R in the hole 34 becomes larger as the distance d from the contact portion 33 increases, even when the holes 34 are formed, each bracket 30 can be rotated about the tip 33c of the contact portion 33 as a fulcrum, and the rotation angle θ can be adjusted. Furthermore, because the width w along the rotation direction R in the hole 34 is smaller at a position closer to the contact portion 33, the bolts 40 are less likely to be displaced in the holes 34, and the pair of brackets 30 can be stably attached in the proper position.

The force required to change the angle of the platform attachment surface 35c with respect to the extending surface 32a is smaller than the force required to deform the shelf 20. Thus, for example, when the pair of platform attachment surfaces 35c are not parallel to each other before the shelf 20 is attached (i.e., when there is a misalignment between the pair of platform attachment surfaces 35c), before the shelf 20 deforms due to the misalignment when the shelf 20 is attached, the angles of the pair of platform attachment surfaces 35c can be changed in a direction to reduce the misalignment. This allows the flatness of the shelf 20 to be kept small.

Each platform attachment surface 35c extends along the bottom surface 20b of the shelf 20 from a part (in this example, two separated areas) of the entire length of the upper end 32b of the extending portion 32. By this simple configuration in which the platform attachment surface 35c is formed only at the part of the upper end 32b, the force required to change the angle of the platform attachment surface 35c with respect to the extending surface 32a (i.e., the strength of each bracket 30 against bending deformation) can be set smaller than the force required to deform the shelf 20.

Each bracket 30 is formed with a member thinner than the shelf 20. By this simple configuration in which the thickness of each bracket 30 is set smaller than that of the shelf 20, the force required to change the angle of the platform attachment surface 35c with respect to the extending surface 32a can be set appropriately smaller than the force required to deform the shelf 20.

When the supply holes 5b are formed in the container 5 and the shelf 20 includes the gas supply sections 21, the flatness of the shelf 20 is adjusted to maintain adhesion between each supply hole 5b of the container 5 and the corresponding gas supply section 21, and thus the gas can be properly supplied into the container 5. In particular, by providing the platform attachment surface 35c at a position close to the gas supply section 21 in the X-direction, the platform attachment 35 can bear the force applied to the shelf 20 (gas supply section 21). The force applied to the shelf 20 when the container 5 is placed is distributed to the extending portion 32, the support attachment 31, and each pillar 10 via the platform attachment 35. Thus, the force applied to a portion of the shelf 20 to which the platform attachment 35 is not attached in the X-direction can be reduced, and the amount of deformation of the shelf 20 can be reduced.

This disclosure is not limited to the examples described above. For example, the materials and shapes of the respective configurations are not limited to the materials and shapes described above, and various materials and shapes can be used. For example, the pair of brackets 30 may be attached to a single support member having two side surfaces 10b opposed in the Y-direction instead of the pair of pillars 10.

The support attachment surface may be an inner surface of the support attachment 31. Each pillar may have, for example, a configuration in which the side surface of each pillar extends rearward from the inner end, in the Y-direction, of the front surface of the pillar. In other words, the side surfaces of the respective pillars may be formed to face inward and be opposed to each other. At this time, the outer surface of the support attachment 31 is in contact with the side surface of each pillar. At this time, the extending surface (i.e., the surface continuous with the support attachment surface) is the inner surface of the extending portion 32.

The extending portion 32 may extend to the front end of the shelf 20. The extending surface 32a does not have to be a surface extending in the X-direction and the Z-direction. The extending portion 32 is, for example, a portion extending at least in the X-direction, and one surface of this extending portion 32 may be the extending surface 32a. The extending surface 32a may include the outer surface of the third extension 35a.

Each bracket 30 does not have to have the contact portion 33. In this example, the pair of brackets 30 cannot be rotated in the rotation direction R about the tip 33c of the contact portion 33, but the rotation angles of the pair of brackets 30 can be adjusted by moving the holes 34 relative to the shaft parts 40b of the bolts 40.

In each bracket 30, only one hole 34 may be formed. Alternatively, one bolt 40 that is disposed through one hole 34 of the holes 34 may serve as the central axis of rotation of each bracket 30. In this example, this one hole 34 has a size just enough to allow the shaft part 40b of the bolt 40 to be inserted through it, i.e., has substantially the same diameter as that of the shaft part 40b.

The shape of each hole 34 is not limited to a circular shape. For example, each hole 34 may be formed in an arch shape extending wide along the rotation direction R. The shapes of the holes 34 may be all the same or may be different from one hole 34 to another. The holes 34 do not necessarily have to be formed such that the width w along the rotation direction R becomes larger as the distance from the contact portion 33 increases.

In the above example, the platform attachment 35 is provided in a part of the upper end 32b of the extending portion 32. However, the platform attachment 35 may be provided over the entire upper end 32b of the extending portion 32. The strength of the bracket 30 may be equal to the strength of the shelf 20 or higher than the strength of the shelf 20. The platform attachment 35 (platform attachment surface 35c) may be provided on the whole upper end 32b of the extending portion 32 (extending surface 32a) (i.e., over the entire area of the upper end 32b). The storage device 1 only needs to have at least one of the following configurations in which: the area of the hole 34 is larger than the area of a cross-section of the bolt 40 orthogonal to the Y-direction (i.e., each bracket 30 can be rotated along the rotation direction R); and the force required to change the angle of the platform attachment surface 35c with respect to the extending surface 32a is smaller than the force required to deform the shelf 20. If the configuration in which each bracket 30 is rotated along the rotation direction R is not used, the bracket does not necessarily have to be attached to the side surface of the corresponding pillar 10. For example, each bracket may be attached to the corresponding pillar 10 by providing the bracket with a planar portion that faces the front surface 10a of the pillar 10 and joining this planar portion to the front surface 10a.

In each through hole 12, a thread configured to be screwed with the shaft part 40b of the corresponding bolt 40 may be formed. In this example, the nut can be omitted. In this case, fixing of the support attachment 31 to each pillar 10 by the bolt 40 can be unfastened (loosened) by adjusting the length of a portion of the shaft part 40b protruding outward from the side surface 10b of the pillar 10.

The invention claimed is:

1. A storage device comprising:
    a pair of supports each extending in an up-and-down direction and spaced apart in a first direction;
    a pair of attachments each attached to a side surface by a fixing member having a shaft part, the side surface being a surface of each of the pair of supports and facing the first direction; and
    a platform supported by the pair of attachments and on which an article is to be placed, wherein
    each of the pair of attachments has a hole through which the shaft part is disposed,
    an area of the hole is larger than an area of a cross-section of the shaft part orthogonal to an axial direction of the shaft part to such an extent that the pair of attachments are rotatable along the side surfaces of the pair of supports, and
    the article is a container into which gas is able to be supplied through a supply hole formed in a bottom of the container, and
    the platform includes a gas supply section configured to supply the gas into the container through the supply hole.

2. A storage device comprising:
    a pair of supports each extending in an up-and-down direction and spaced apart in a first direction;
    a pair of attachments each attached to a side surface by a fixing member having a shaft part, the side surface being a surface of each of the pair of supports and facing the first direction; and
    a platform supported by the pair of attachments and on which an article is to be placed, wherein
    each of the pair of attachments has a hole through which the shaft part is disposed,
    an area of the hole is larger than an area of a cross-section of the shaft part orthogonal to an axial direction of the shaft part to such an extent that the pair of attachments are rotatable along the side surfaces of the pair of supports, and
    each of the pair of attachments has a contact portion in contact with a front surface that is a surface of the corresponding support along the first direction and the up-and-down direction and oriented in a direction in which the platform is located with respect to the support;
    wherein the pair of attachments are rotatable about the contact portion.

3. The storage device according to claim 2, wherein
    each attachment has a plurality of holes, and each corresponding support has a plurality of holes, wherein the shaft part of a fixing member passes through corresponding holes in each attachment and the corresponding support, and
    the width of each of the holes along a rotation direction of the pair of attachments is formed to become larger as a distance from the contact portion increases.

4. A storage device comprising:
    a pair of supports each extending in an up-and-down direction and aligned in a first direction;
    a pair of attachments each attached to the pair of supports; and
    a platform supported by the pair of attachments and on which an article is to be placed, wherein
    each of the pair of attachments has:
    a support attachment surface attached to the corresponding support;
    an extending surface connected to the support attachment surface and extending in a direction in which the platform is located with respect to the pair of supports,
    a platform attachment surface connected to an upper end of the extending surface and extending along a bottom surface of the platform to support the bottom surface from below,
    the article is a container into which gas is able to be supplied through a supply hole formed in a bottom of the container, and
    the platform includes a gas supply section configured to supply the gas into the container through the supply hole,
    wherein force required to change the angle of the platform attachment surface with respect to the extending surface is smaller than force required to deform the platform.

5. The storage device according to claim 4, wherein the platform attachment surface extends along the bottom surface of the platform from a part of an entire length of the upper end of the extending surface.

6. The storage device according to claim 4, wherein each of the pair of attachments is formed with a member thinner than the platform.

* * * * *